United States Patent
Ogawa et al.

(10) Patent No.: US 7,550,792 B2
(45) Date of Patent: Jun. 23, 2009

(54) SOLID-STATE IMAGING DEVICE AND MANUFACTURING METHOD THEREOF

(75) Inventors: Masaaki Ogawa, Kanagawa-ken (JP); Takashi Doi, Kanagawa-ken (JP); Toshihiko Kitamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 11/778,314

(22) Filed: Jul. 16, 2007

(65) Prior Publication Data
US 2008/0210985 A1 Sep. 4, 2008

(30) Foreign Application Priority Data
Jul. 24, 2006 (JP) .............................. 2006-200920

(51) Int. Cl.
*H01L 27/148* (2006.01)
*H01L 31/101* (2006.01)

(52) U.S. Cl. ........................ 257/233; 257/292; 257/461; 257/E31.032; 257/E31.054

(58) Field of Classification Search ................. 257/225, 257/233, 290, 292, 439, 443, 461, 463, E31.032, 257/E31.054
See application file for complete search history.

(56) References Cited

U.S. PATENT DOCUMENTS

| | | | | |
|---|---|---|---|---|
| 5,514,887 A | * | 5/1996 | Hokari | 257/222 |
| 6,232,626 B1 | * | 5/2001 | Rhodes | 257/292 |
| 6,881,943 B1 | | 4/2005 | Yegnashankaran | |
| 6,903,395 B2 | * | 6/2005 | Nakai et al. | 257/294 |
| 7,045,785 B2 | * | 5/2006 | Iida et al. | 250/338.1 |
| 7,193,289 B2 | * | 3/2007 | Adkisson et al. | 257/431 |
| 7,364,933 B2 | * | 4/2008 | Kim | 438/65 |
| 2003/0173582 A1 | * | 9/2003 | Hatano et al. | 257/184 |
| 2005/0040440 A1 | * | 2/2005 | Murakami | 257/225 |
| 2005/0121708 A1 | | 6/2005 | Hong | |

OTHER PUBLICATIONS

U.S. Appl. No. 11/751,807, filed May 22, 2007, Atsuko Yamashita, et al.

* cited by examiner

*Primary Examiner*—Victor A Mandala
*Assistant Examiner*—Scott Stowe
(74) *Attorney, Agent, or Firm*—Oblon, Spivak, McClelland, Maier & Neustadt, P.C.

(57) ABSTRACT

A solid-state imaging device, includes: a substrate where a region of a first conductivity type is formed on at least a portion of a surface thereof; a region of a second conductivity type formed on at least a portion of a surface of the region of the first conductivity type; a multilayer wiring layer formed on the substrate; and a layer of the second conductivity type formed directly above the region of the second conductivity type in the multilayer wiring layer, connected to the region of the second conductivity type. A concentration of impurities in the layer of the second conductivity type is lower with decreasing proximity to the region of the second conductivity type.

12 Claims, 11 Drawing Sheets

SOLID-STATE IMAGING DEVICE AND MANUFACTURING METHOD THEREOF

CROSS-REFERENCE TO RELATED APPLICATIONS

This application is based upon and claims the benefit of priority from the prior Japanese Patent Application No. 2006-200920, filed on Jul. 24, 2006; the entire contents of which are incorporated herein by reference.

BACKGROUND OF THE INVENTION

1. Field of the Invention

The present invention relates to a solid-state imaging device and to a manufacturing method thereof, and in further detail relates to a solid-state imaging device that can form an image by light impinging on a photo diode formed on a substrate surface, and to a manufacturing method thereof.

2. Background Art

Solid-state imaging devices which use a CCD (Charge-Coupled Device) or a CMOS (Complementary Metal Oxide Semiconductor) are being required to have cost reductions by reducing the chip size and to have increased resolution with increased pixels, and reducing the pixel size is critical.

However, a solid-state imaging device normally consists of a semiconductor substrate and a multilayer wiring layer established thereon. Furthermore, a photoreceptor known as a PD (Photo Diode) is formed on the semiconductor substrate surface, and light coming from the outside passes through a cylindrical light guiding unit established in the multilayer wiring layer and reaches the PD. Therefore, if the pixel size is reduced, the photoreceptor surface area will be smaller and the aspect ratio of the light guiding unit will increase, the amount of incident light for each pixel will be reduced, sensitivity will be reduced, the amount of skewed light entering the peripheral areas of the chip will be dramatically reduced, and sensitivity variation (shading) will be noticeable. Furthermore, the distance between the light guiding units will be shorter so the light from adjacent pixels will easily mix, and crosstalk will easily occur.

The point for resolving these problems is how to increase the light collecting efficiency of the PD. Several methods have been proposed as means for increasing the light collecting efficiency of the PD. For example, a method to increase the efficiency of using the light that impinges on the light guiding unit has been proposed wherein an on-chip micro-lens is established on the multilayer wiring layer along with an inner lens (lens inside the layer) consisting of a highly refractive material such as SiN, and this inner lens is located on the light path between the PD and the on-chip micro-lens. Furthermore, another method has been proposed where a material with a refractive index higher than an interlayer insulative film is embedded in the light guiding unit in a multilayer wiring layer to form a light guiding wave path, and the light that impinges on the light guiding unit is enclosed inside the light guiding wave path in order to transfer the light to the PD with high efficiency. (For example, refer to Patent Documentation 1).

However, with the aforementioned methods, if the pixel size becomes much smaller in the future and the diameter of the light guiding unit become smaller than approximately ½ of the visible light wavelength, impinging light on the light guiding unit will become difficult, and there will be problems in that the increased efficiency of collecting light to the PD will be insufficient.

SUMMARY OF THE INVENTION

According to an aspect of the invention, there is provided a solid-state imaging device, including: a substrate where a region of a first conductivity type is formed on at least a portion of a surface thereof; a region of a second conductivity type formed on at least a portion of a surface of the region of the first conductivity type; a multilayer wiring layer formed on the substrate; and a layer of the second conductivity type formed directly above the region of the second conductivity type in the multilayer wiring layer, connected to the region of the second conductivity type; a concentration of impurities in the layer of the second conductivity type being lower with decreasing proximity to the region of the second conductivity type.

According to another aspect of the invention, there is provided a manufacturing method for a solid-state imaging device, including: forming a region of a second conductivity type on at least a portion of a surface of a region of a first conductivity type which is formed on at least a portion of a surface of a substrate; forming a multilayer wiring layer on the substrate; forming an opening which extends to the region of the second conductivity type in a region directly above the region of the second conductivity type of the multilayer wiring layer; and forming a layer of the second conductivity type which connects to the region of the second conductivity type by causing a semiconductor layer to grow in the opening while doping with an impurity of the second conductivity type, an amount of the impurity of the second conductivity type being reduced in conjunction with the growth of the semiconductor layer when forming the layer of the second conductivity type.

DETAILED DESCRIPTION

Figure 1:
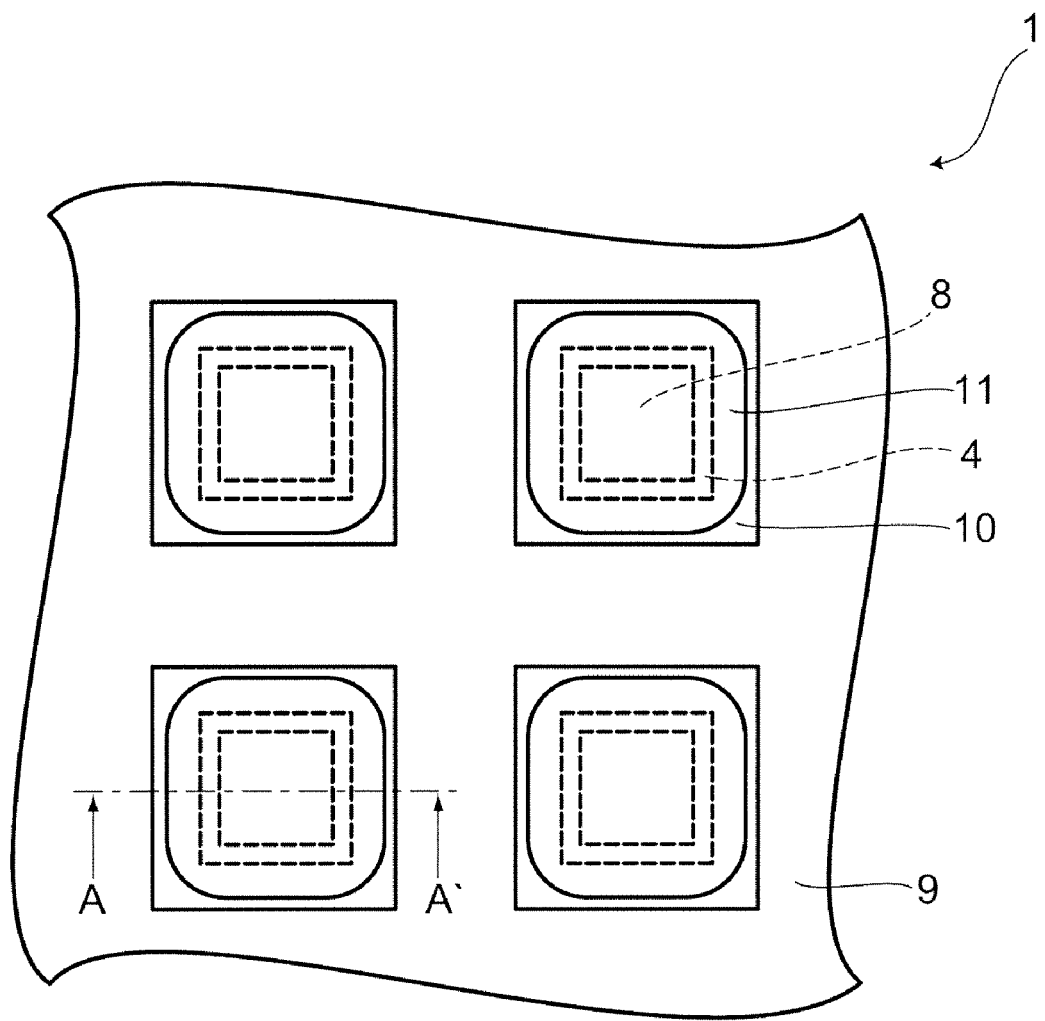
FIG. 1 is a top view diagram showing an example of a solid-state imaging device according to the first embodiment of the present invention.

Embodiments of the present invention will be described below while referring to the drawings. Note, identical items in each of the drawings have been assigned the same reference numerals.

First Embodiment

First, the first embodiment of the present invention will be described.

Figure 2:
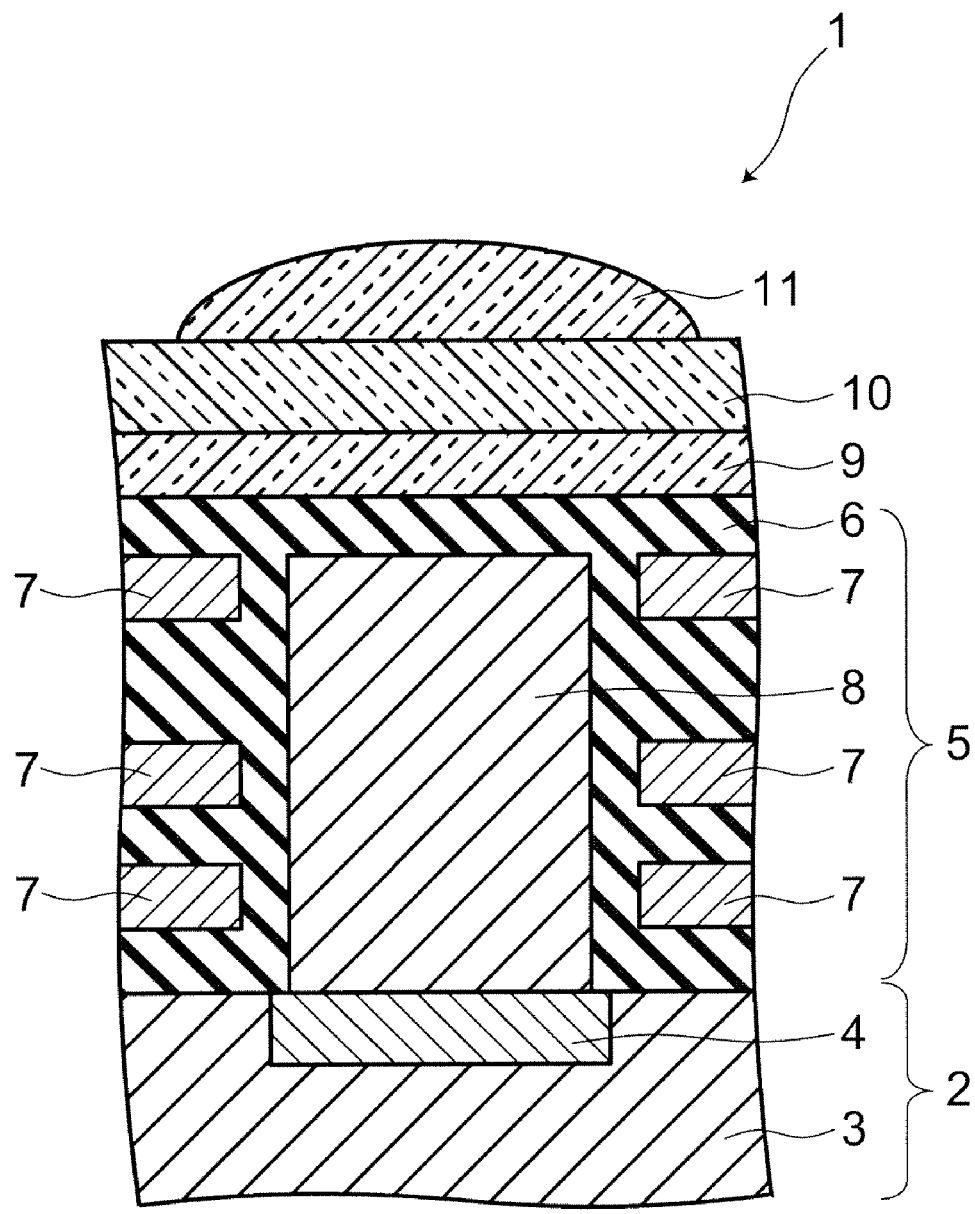
FIG. 2 is a cross section diagram along line A-A' shown in FIG. 1.

FIG. 1 is a top view diagram showing an example of the solid-state imaging device according to the present embodiment, and FIG. 2 is a cross section diagram along line A-A' in FIG. 1. Note, in FIG. 2, only one pixel of the solid-state imaging device is shown.

As shown in FIG. 1 and FIG. 2, the solid-state imaging device of the present embodiment has a silicon substrate 2, and a P type well 3 is formed on a portion of the surface of the silicon substrate 2. Furthermore, an N type region 4 is formed on a portion of the surface of the P type well, and is exposed on the surface on the silicon substrate 2. Looking from the direction perpendicular to the surface of the silicon substrate 2 (hereinafter referred to as "viewed from the top"), the shape of the N type region 4 is for instance a square. A plurality of N type regions 4 are arranged in a matrix shape, for instance, on the surface of the silicon substrate 2, and each of the N type regions 4 forms a PN connection with the P type wells 3, thus forming a PD (photo diode) which is a photoreceptor. Furthermore, in addition, a diffusion layer (not shown in the drawings) for a CCD or CMOS transistor, which is a charge transfer unit, is formed on the silicon substrate 2.

On the other hand, a multilayer wiring layer 5 is formed on the silicon substrate 2. The multilayer wiring layer 5 consists of a plurality of wiring layers 7 embedded in an interlayer insulative film 6. The interlayer insulative film 6 is formed from an insulative material such as $SiO_2$ or the like. The wiring 7 is formed from a high melting point metal such as Cu, Ti, Mo, or W, or the like, or from a silicide of a high melting point metal such as TiSi, MoSi, or WSi or the like. Furthermore, either a light shielding film (not shown in the drawings) is formed on the multilayer wiring layer 5, or a portion of the wiring 7 acts as a light shielding film. Furthermore, a transfer electrode (not shown in the drawings) for the charge transfer unit is also formed on multilayer wiring layer 5.

Furthermore, a pillar-shaped N type Si layer 8 is formed on the region directly above the N type region 4 in the multilayer wiring layer 5. As viewed from the top, the outer edge of the N type Si layer 8 essentially matches the outer edge of the N type region 4, or is positioned slightly to the inside. The bottom surface of the N type Si layer 8 is connected to the N type region 4, and the top surface of the N type Si layer 8 is covered by a thin interlayer insulative film 6. Note, the N type Si layer 8 is not connected to the wiring 7, and component members such as wiring 7, transfer electrode, and shielding film or the like are not formed in the N type Si layer 8. Furthermore, the concentration of impurities in the N type Si layer 8 is essentially equal to the concentration of impurities in the N type region 4 in proximity to the interface with the N type region 4, or in other words at the bottom edge, and the concentration continuously decreases toward the top, or in other words when moving away from the N type region 4.

After the multilayer wiring layer 5 is formed on the silicon substrate 2, a hole that has essentially the same area as the area of the N type region 4 when viewed from the top is formed by RIE (Reactive Ion Etching) in the region directly above the N type region 4 in the multilayer wiring layer 5, and while doping with an N type impurity such as P (phosphorus), the N type Si layer 8 is formed by epitaxial growth up to the height of the top layer of the wiring 7 of the multilayer wiring layer 5 from the surface of the N type region 4 inside the hole. The doping quantity of the N type impurity is set to be a quantity such that the concentration of impurity of the N type Si layer 8 at the start of film forming is essentially equal to the concentration of impurity in the N type region 4, and the doping amount is gradually reduced as the Si layer grows. The method for forming the N type Si layer 8 may for instance be a method where a gas blend of silane ($SiH_4$) and phosphene ($PH_3$) is used as a raw material gas, and the flowrate of the $PH_3$ gas is gradually reduced while the Si layer grows by gas phase epitaxial growth at a temperature of approximately 700° C.

A resin leveling film 9 is formed on the multilayer wiring layer 5, and a color filter 10 is established in the region that includes the region directly above the N type Si layer 8 on the leveling film 9. Furthermore, a convex lens shaped microlens 11 is formed on the color filter 10. As viewed from the top, the shape of the color filter 10 is for instance a square, and the shape of the microlens 11 is for instance a square with rounded corners.

As an example of the dimensions of each part of a solid-state imaging device 1 as viewed from the top, the length of one side of the N type region 4 is for instance 1.0 μm. Furthermore, the length of one side of the microlens is for instance between 1.0 and 3.0 μm. On the other hand, as an example of the thickness of each layer, the thickness of the multilayer wiring layer 5 is for instance between 2 and 3 μm, the thickness of the leveling film 9 is for instance 0.5 μm, the thickness of the color filter 10 is for instance 1.0 μm, and the maximum thickness of the microlens 11 is for instance 0.5 μm.

Furthermore, as an example of the concentration of impurities in each component, the concentration of P type impurities in the P type well 3 is for instance on the order of $1 \times 10^{15}$ $cm^{-3}$, and the concentration of N type impurity in the N type region 4 is for instance on the order of $1 \times 10^{17}$ $cm^{-3}$. Furthermore, the concentration of N type impurity in the N type Si layer 8 is essentially the same level as the N type region 4, on the order of $1 \times 10^{17}$ $cm^{-3}$ on the bottom, and in a range on the order of between $1 \times 10^{15}$ and $1 \times 10^{16}$ $cm^{-3}$ at the top.

Next, the function of the solid-state imaging device of the present embodiment will be described.

Figure 3:
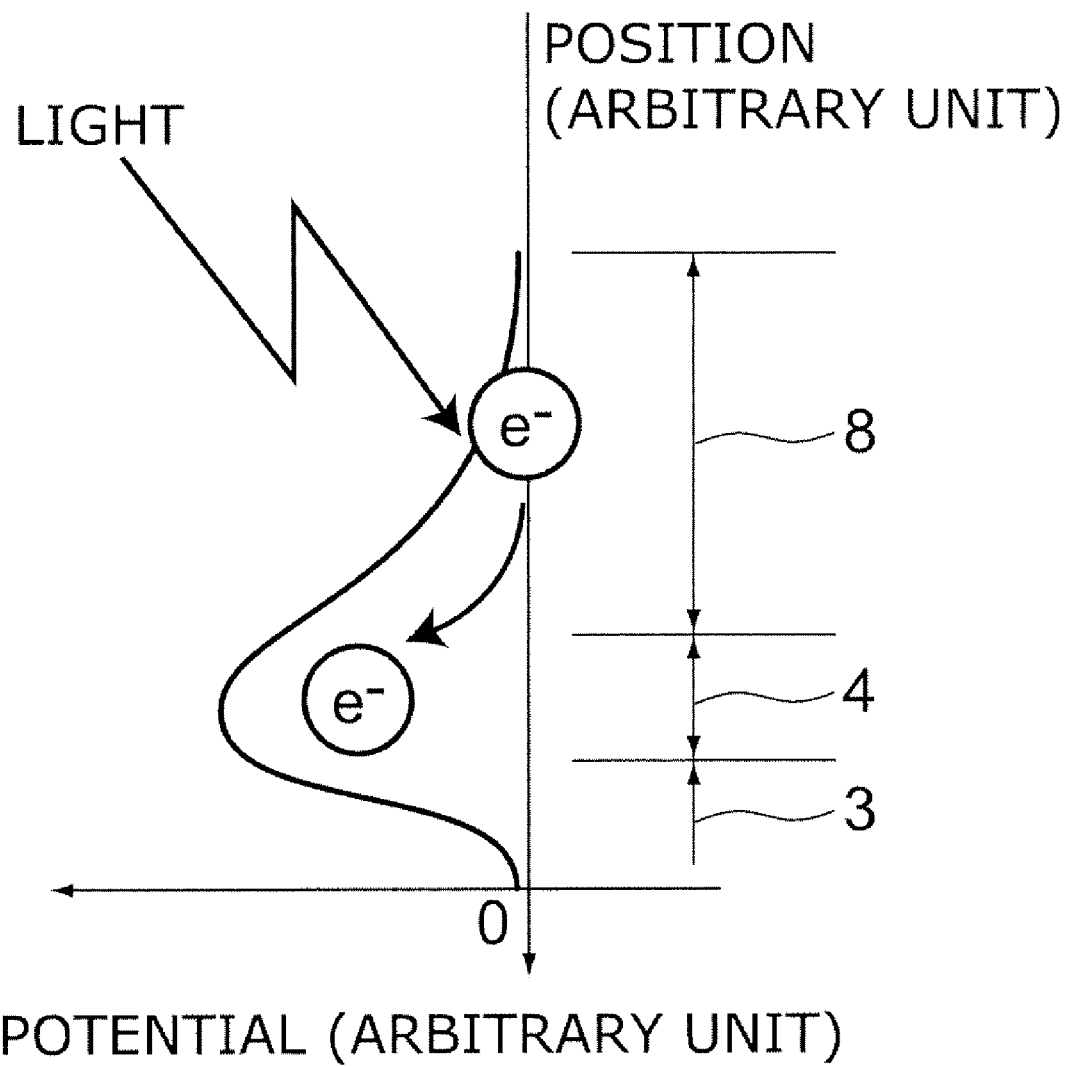
FIG. 3 is a schematic graph showing an example of the potential distribution for the solid-state imaging device of the first embodiment, wherein the potential is shown on the horizontal axis, and the position in the height direction is shown on the vertical axis.

FIG. 3 is a schematic graph showing an example of the potential distribution for the solid-state imaging device of this embodiment, wherein the potential is shown on the horizontal axis, and the position in the height direction is shown on the vertical axis. Note, in FIG. 3, the components (P type well 3, N type region 4, N type Si layer 8) are shown on the vertical axis corresponding to the position in the solid-state imaging device, and the behavior of electrons that are excited by incident light is also shown.

As shown in FIG. 3, the concentration of impurities in the N type Si layer 8 is sloped, and therefore the potential is also sloped. Specifically, the concentration of N type impurities increase toward the bottom in the N type Si layer 8, so the potential becomes more positive toward the bottom. Furthermore, the concentration of impurities in the N type Si layer 8 is the highest at the bottom, or in other words the contact surface with the N type region 4, and is essentially equal to the concentration of impurities in the N type region 4. Furthermore, the potential is highest in the N type region 4.

As shown in FIG. 2 and FIG. 3, when light enters from the top of the solid-state imaging device 1, the light is collected by the microlens 11, and the wavelength component is selected by passing through a color filter 10. The light passes through the leveling film 9, and impinges on the top surface of the N type Si layer 8. This light is photoelectrically converted in the N type Si layer 8, and electrons ($e^-$) are generated. At this time, the potential in the N type Si layer 8 becomes more positive towards the bottom, so the force that acts on the electrons ($e^-$) is stronger towards the bottom. As a result, the electrons ($e^-$) move downward and are drawn into the N type region 4, and accumulate in the N type region 4. Furthermore, the electrons which have accumulated in the N type region 4 are read at the designated timing by the action of the charge transfer unit.

Next, the effects of the present embodiment will be described.

As described above, with the present embodiment, the light that enters the solid-state imaging device 1 is photoelectrically converted in the N type Si layer 8, so the light path length from the point that the light enters the microlens 11 to the point where the light is photoelectrically converted will be shorter than the case where an N type Si layer 8 is not established. This effect is the same effect as if the distance between the microlens 11 and the N type region 4 which is the photoreceptor unit is shortened in a device where an N type Si layer 8 is not established. In other words, when the light which has passed through the microlens 11, color filter 10, and leveling film 9 impinges on the multilayer wiring layer 5, the light will enter the N type Si layer 8 and be photoelectrically converted, essentially without passing through the interlayer insulative film 6. Therefore, the light which enters the solid-state imaging device 1 is not required to pass through a pillar-shaped light guiding unit established in the multilayer wiring layer, as with a conventional solid-state imaging device. As a result, the light collecting efficiency of the photoreceptor unit can be increased.

Therefore, with this embodiment, even if the pixel size is reduced and the aperture of the PD becomes smaller, the light collecting properties can be maintained or increased, and a solid-state imaging device with high efficiency for collecting light to the photoreceptor unit can be achieved. As a result, a reduction in sensitivity can be controlled by reducing the amount of light entering each pixel, and color mixing (crosstalk) due to the light entering adjacent pixels can also be suppressed.

Second Embodiment

Next, the second embodiment of the present invention will be described.

Figure 4:
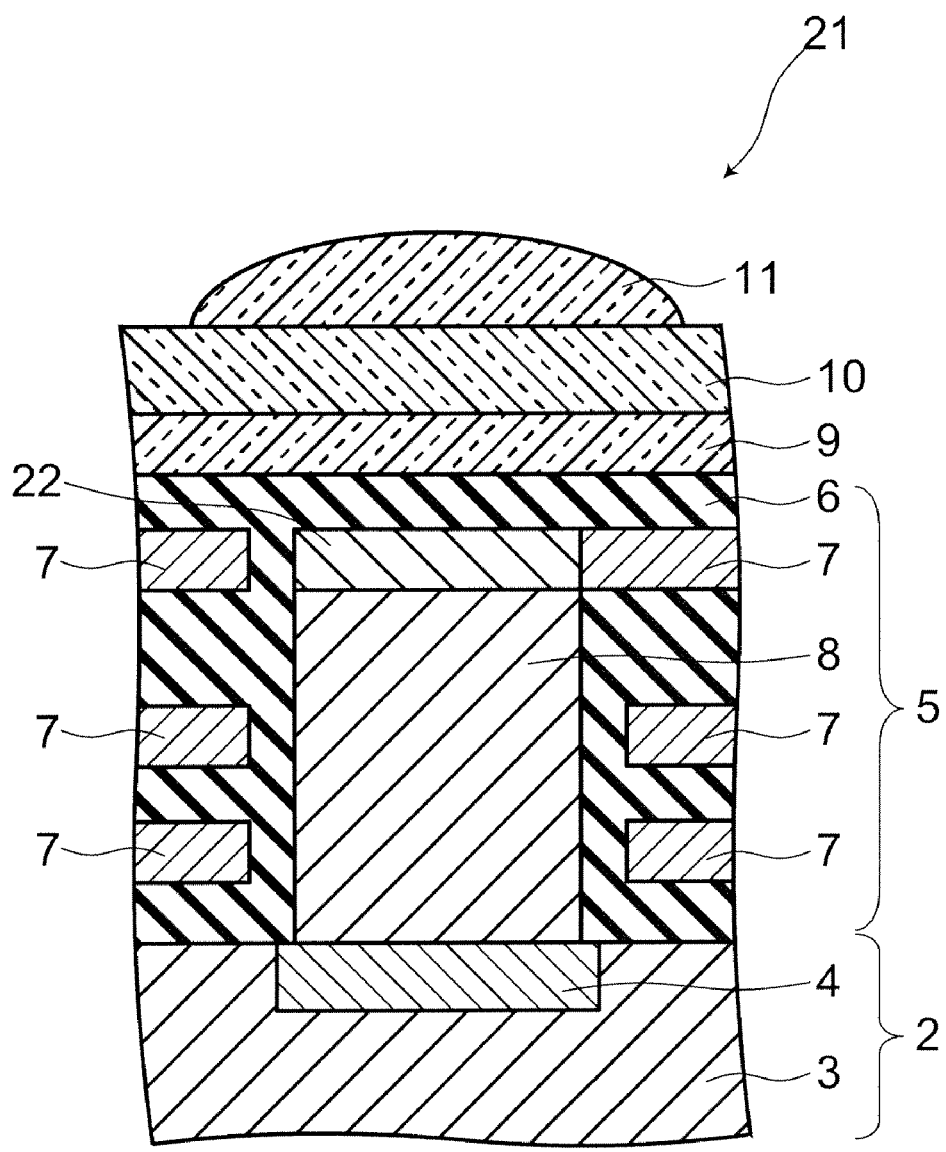
FIG. 4 is a cross section diagram showing an example of a solid-state imaging device according to the second embodiment of the present invention.

FIG. 4 is a cross section diagram showing an example of a solid-state imaging device according to this embodiment.

As shown in FIG. 4, the solid-state imaging device 21 of this embodiment has a $P^+$ type Si layer 22 on the N type Si layer 8. The concentration of P type impurities in the $P^+$ type Si layer 22 is for instance on the order of $1 \times 10^{19}$ cm$^{-3}$. The $P^+$ type Si layer 22 can be formed for instance by changing the doping impurity to a P type impurity such as B (boron) after epitaxially growing the N type Si layer 8, and then continuing to epitaxially grow the Si layer. For example, after forming a N type Si layer 8 by epitaxial growth of a Si layer at a temperature of approximately 700° C. using a gas blend of silane ($SiH_4$) and phosphene ($PH_3$), the raw material gas was changed from $PH_3$ to diboran ($B_2H_6$), to form a $P^+$ type Si layer 22 using gas phase epitaxial growth of an Si layer at the same temperature. Therefore, the $P^+$ type Si 22 is in contact with the N type Si layer 8. Furthermore, the $P^+$ type Si layer 22 is in contact with the top layer wiring 7 of the multilayer wiring layer 5. Moreover, the top surface of the $P^+$ type Si layer 2 is covered by the interlayer insulative film 6. Constructions other than those mentioned above in this embodiment are the same as the aforementioned first embodiment.

Next, the function of the solid-state imaging device of the present embodiment will be described.

Figure 5:
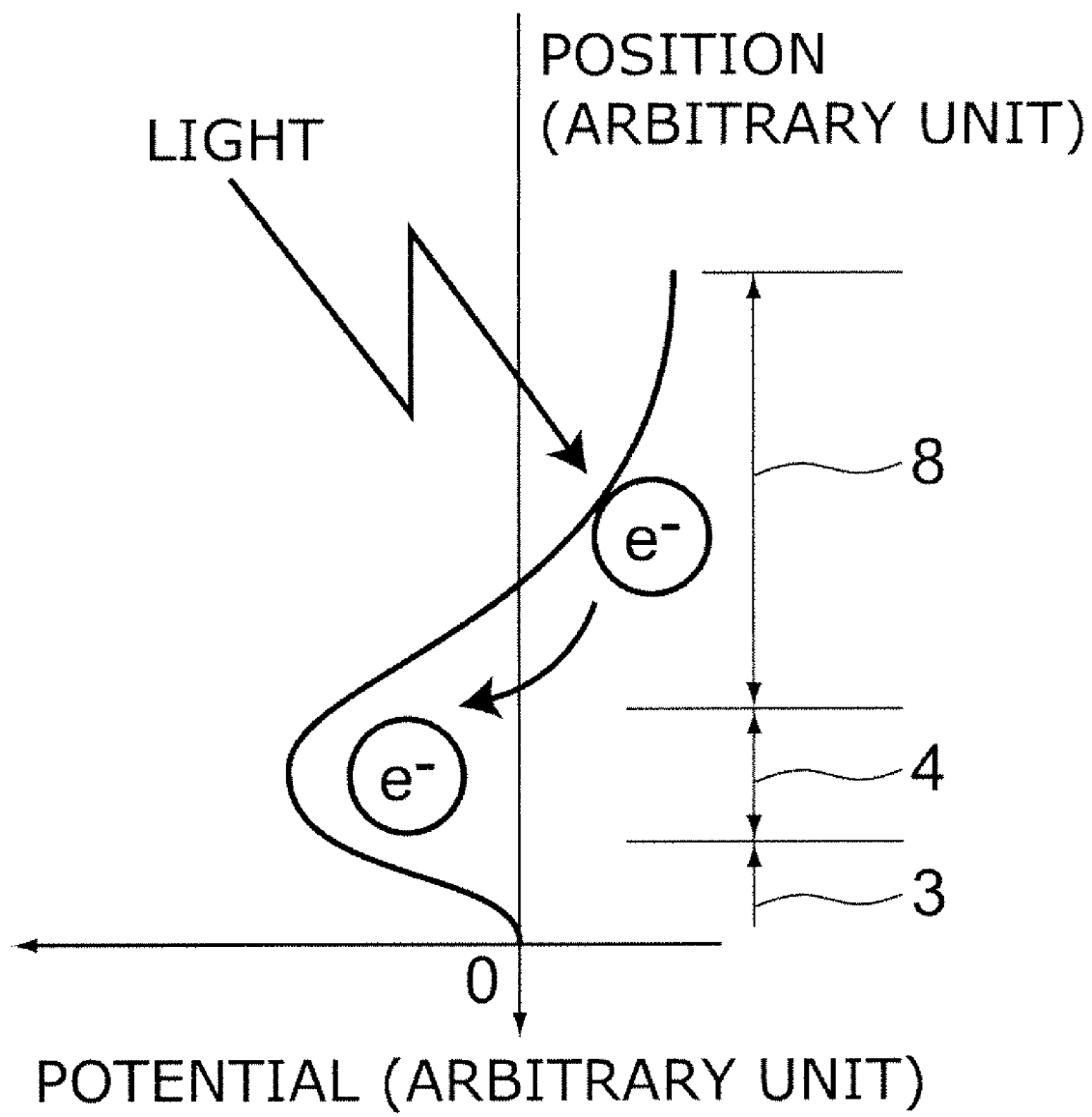
FIG. 5 is a schematic graph showing an example of the potential distribution for the solid-state imaging device of the second embodiment, wherein the potential is shown on the horizontal axis, and the position in the height direction is shown on the vertical axis.

FIG. 5 is a schematic graph showing an example of the potential distribution for the solid-state imaging device of this embodiment, wherein the potential is shown on the horizontal axis, and the position in the height direction is shown on the vertical axis. Note, in FIG. 5, the components (P type well 3, N type region 4, N type Si layer 8) are shown on the vertical axis corresponding to the position in the solid-state imaging device, and the behavior of electrons that are excited by incident light is also shown.

As shown in FIG. 4 and FIG. 5, with this embodiment, a potential lower than the P type well 3 is applied through the wiring 7 and the P+ type Si layer 22 to the top edge of the N type Si layer 8. For example, a ground potential is applied to the P type well 3, and a negative potential is applied to the top of the N type Si layer 8. Thereby, an electric field is formed from the bottom edge toward the top edge in the N type Si layer 8. As a result, a downward force due to the concentration gradient in the N type Si layer 8 and a downward force due to the electric field act on the electrons ($e^-$) that are generated by photoelectric conversion in the N type Si layer 8. Therefore, the electrons can be more positively drawn into the N type region 4.

Furthermore, by covering the top surface of the N type Si layer 8 with a $P^+$ type Si layer 22, the dark current generated because of surface imperfections of the N type Si layer 8 or because of dangling bonds which exist at the interface between the N type Si layer 8 and the interlayer insulative film 6 can be suppressed. As a result, noise in the image taken by the solid-state imaging device 21 can be reduced. The function and effects of the present embodiment other than those described above are the same as for the aforementioned first embodiment.

Third Embodiment

Next, the third embodiment of the present invention will be described.

Figure 6:
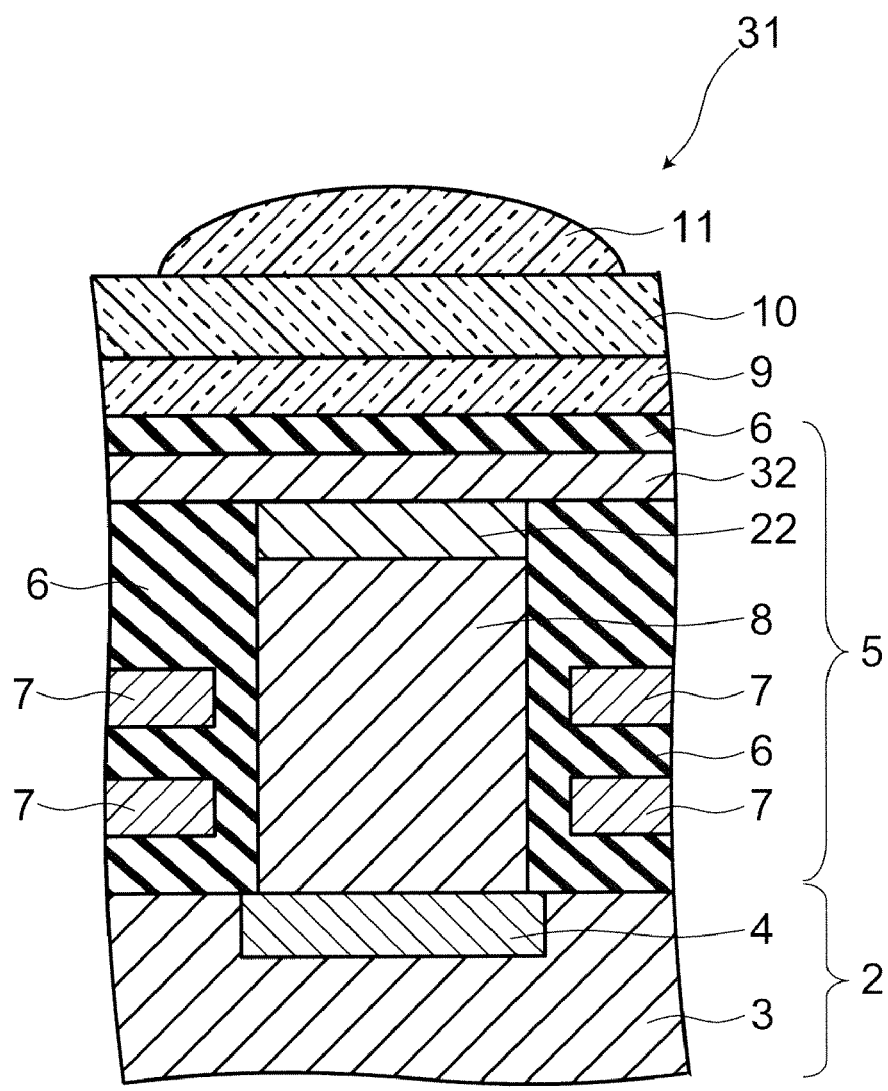
FIG. 6 is a cross section diagram showing an example of a solid-state imaging device according to the third embodiment of the present invention.

FIG. 6 is a cross section diagram showing an example of a solid-state imaging device according to this embodiment.

As shown in FIG. 6, the solid-state imaging device 31 of this embodiment has a transparent electrode 32 established in the multilayer wiring layer 5 in addition to the construction of the solid-state imaging device 21 (refer to FIG. 4) of the aforementioned second embodiment. The transparent electrode 32 is formed from a transparent conductive material such as ITO (Indium tin oxide) or ZnO (zinc oxide) or the like. The transparent electrode 32 is formed above the $P^+$ type Si layer 22, but the top surface is covered by the interlayer insulative film 6. Furthermore, the bottom surface of the transparent electrode 32 is connected to the $P^+$ type Si layer 22. Thereby, the electric potential is applied to the $P^+$ type Si layer 22 by the transparent electrode 32, rather than the wiring 7.

According to this embodiment, an electric field is formed in the N type Si layer 8 by applying a bias potential between the P type well 3 and the transparent electrode 32, and the same effects as the aforementioned second embodiment can be achieved. Furthermore, with this embodiment, the wiring 7 is not required to be extended to the P+ type Si layer 22, so the aperture ratio can be further increased. The construction, function, and effects of this embodiment other than those described above are the same as for the aforementioned second embodiment.

Fourth Embodiment

Next, the fourth embodiment of the present invention will be described.

Figure 7:
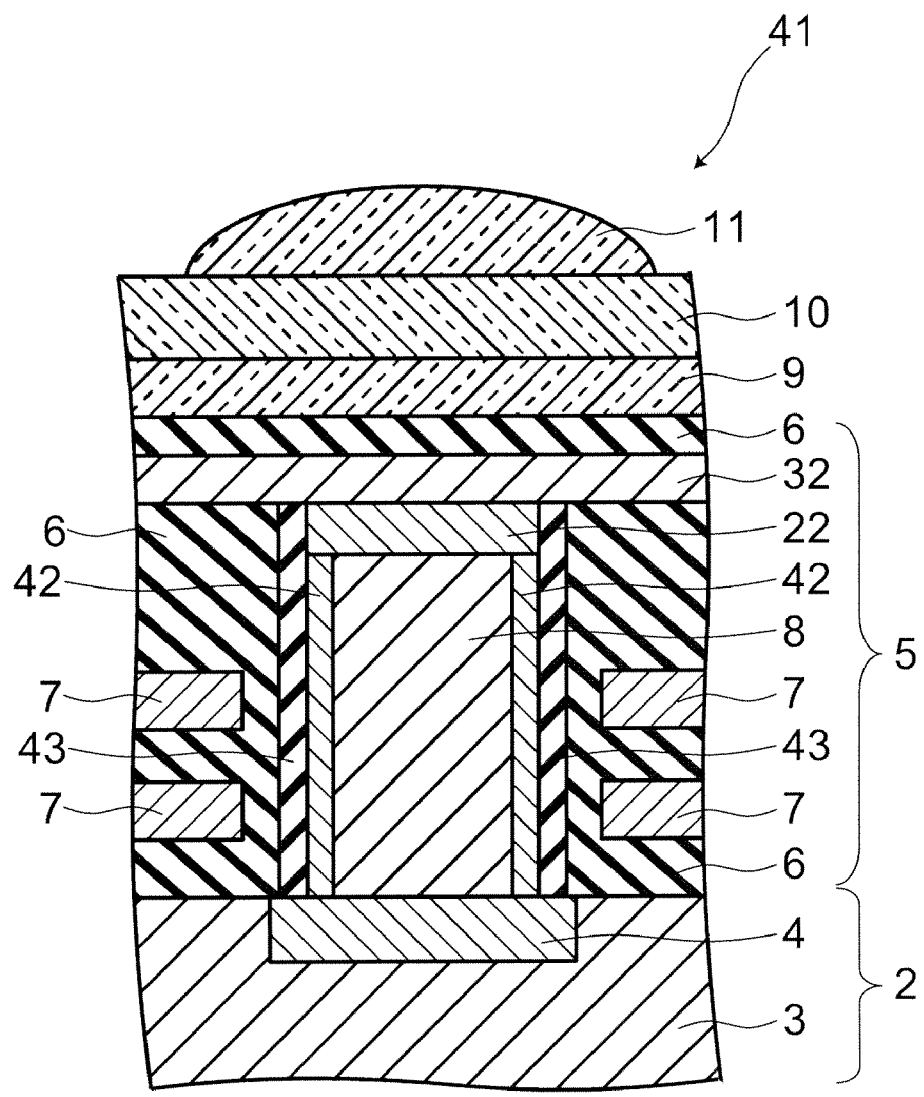
FIG. 7 is a cross section diagram showing an example of a solid-state imaging device according to the fourth embodiment of the present invention.

FIG. 7 is a cross section diagram showing an example of a solid-state imaging device according to this embodiment.

As shown in FIG. 7, the solid-state imaging device 41 of this embodiment has a P type layer 42 on a side surface of the N type Si layer 8 in addition to the construction of the solid-state imaging device 31 (refer to FIG. 6) of the aforementioned third embodiment. The P type layer 42 is formed from Si containing a P type impurity such as B (boron). Note, the P type layer 42 is in contact with the N type Si layer 8 and the P+ type Si layer 22. Furthermore, a BSG (Boron Silicate Glass) film 43 is established farther toward the outside of the P type layer 42.

Next, the manufacturing method for the solid-state imaging device 41 of the present embodiment will be described.

FIG. 8 through FIG. 11 are cross sectional process diagrams showing an example of a manufacturing method for a solid-state imaging device according to this embodiment.

Figure 8:
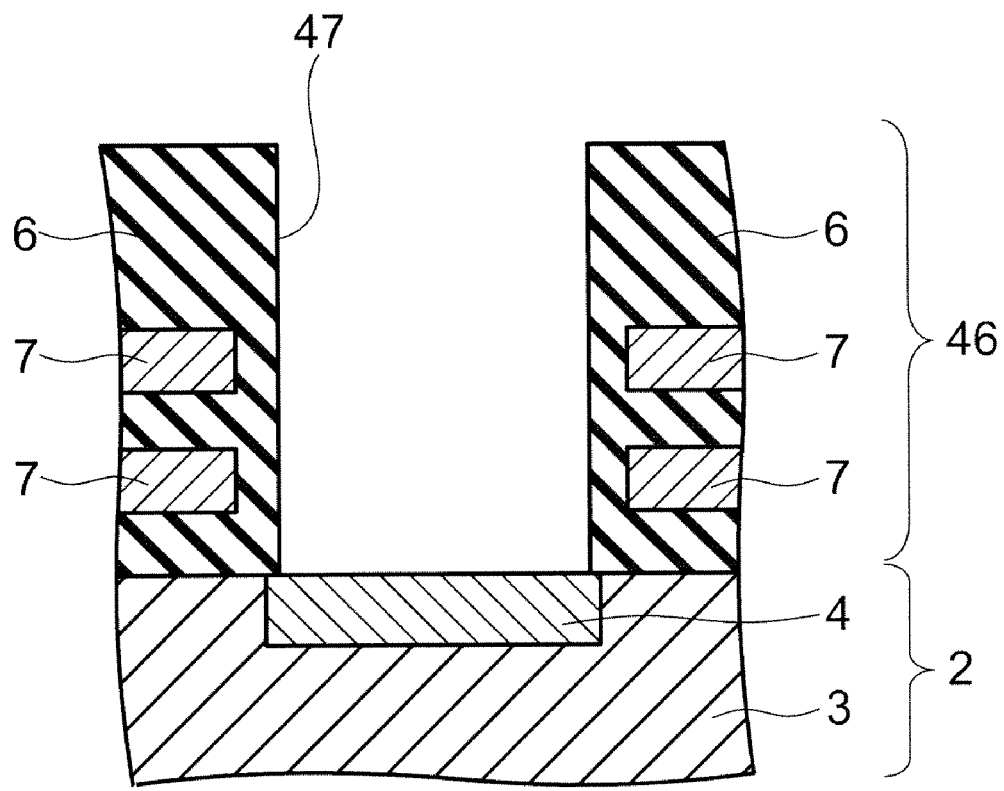
FIG. 8 is a cross sectional process diagram showing an example of a manufacturing method for a solid-state imaging device according to the fourth embodiment.

First, as shown in FIG. 8, a P type well 3 is formed on a portion of the surface of the silicon substrate 2, and a N type region 4 is formed on a portion of the surface of this P type well 3. Note, a CCD or CMOS transistor dispersion layer (not shown in the drawings) or the like which is an electrical charge transfer unit is also formed on the silicon substrate 2 at this time. Next, interlayer insulative film 6 and wiring 7 are alternately formed on the silicon substrate 2 to form a multilayer body 46. Note, a transfer electrode (not shown in the drawings) for the charge transfer unit is also formed at this time. Next, an opening 47 that extends to the N type region 4 is formed in the region directly above the N type region 4 of the multilayer body 46.

Figure 9:
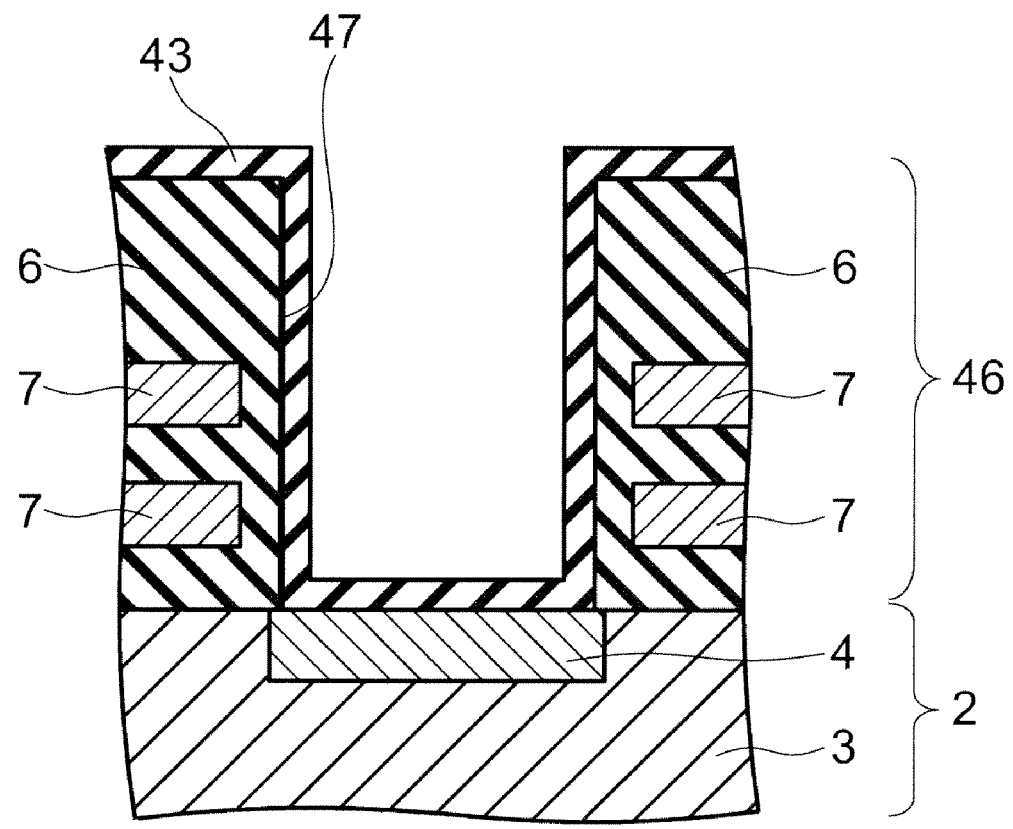
FIG. 9 is a cross sectional process diagram showing an example of a manufacturing method for a solid-state imaging device according to the fourth embodiment.

Next, as shown in FIG. 9, an $SiO_2$ film doped with B is conformally formed on the entire surface by a CVD (Chemical Vapor Deposition) method, and a BSG film 43 is formed. The BSG film 43 is formed continuously along the top surface of the multilayer body 46, the side surface of the opening 47, and the top surface of the N type region 4.

Figure 10:
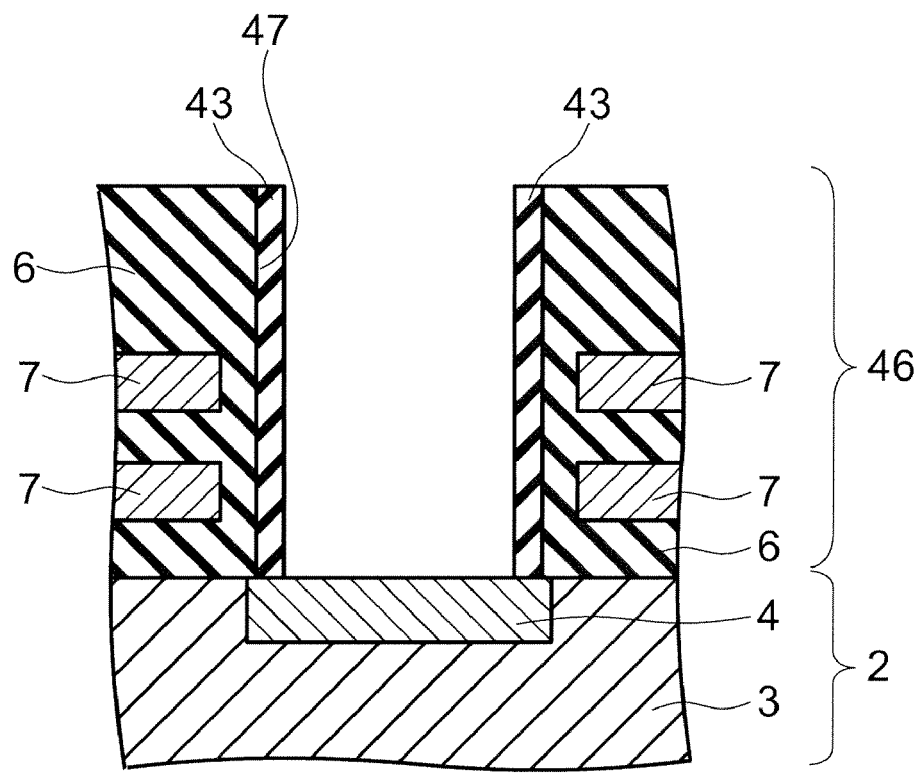
FIG. 10 is a cross sectional process diagram showing an example of a manufacturing method for a solid-state imaging device according to the fourth embodiment.

Next, as shown in FIG. 10, anisotropic etching is performed, and the BSG film 43 that was formed on the top surface of the multilayer body 46 and the top surface of the N type region 4 is removed, and left remaining only on the side surface of the opening 47.

Figure 11:
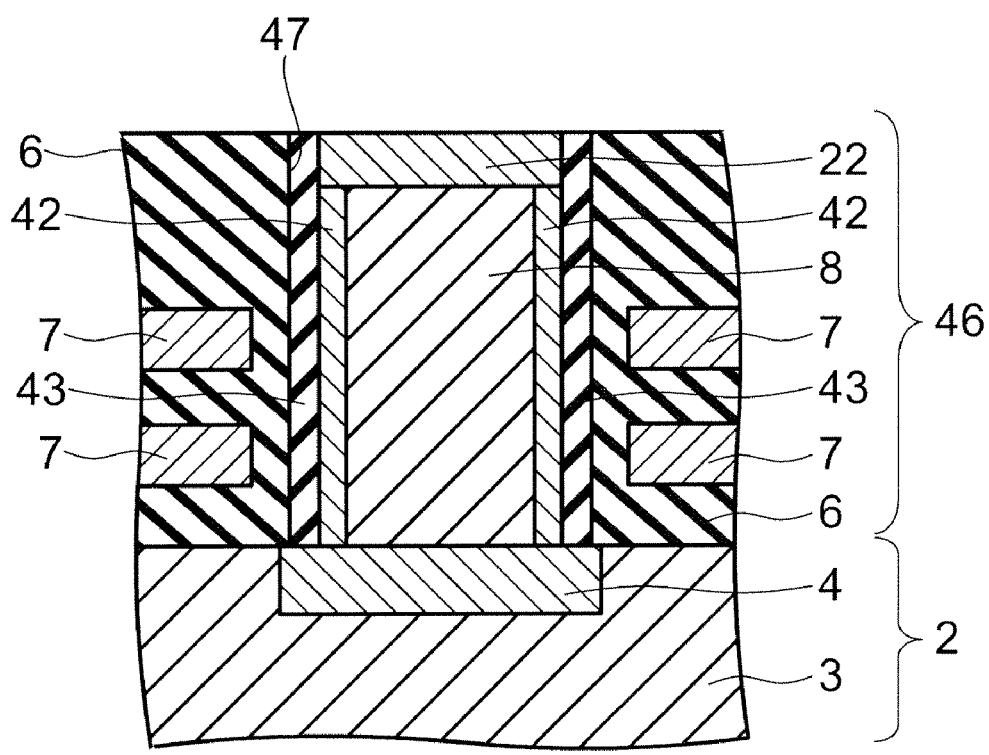
FIG. 11 is a cross sectional process diagram showing an example of a manufacturing method for a solid-state imaging device according to the fourth embodiment.

Next, as shown in FIG. 11, an Si layer is epitaxially grown in the opening 47 while successively doping with N type impurities and P type impurities, in order to form the N type Si layer 8 and the P+ type Si layer 22. The film forming temperature at this time is for instance 700° C. After this, heat treating is performed at a temperature of for instance 900° C. Therefore the B (boron) in the BSG film 43 will disperse (phase dispersion) into the N type Si layer 8 because of the heat treatment at 700° C. and the subsequent heat treatment at 900° C. during the epitaxial growth of the Si layer, and a P type layer of 42 will be formed on the side surface of the N type Si layer 8. Note, at this time, the wiring 7 is formed from a metal with a high melting point or an silicide thereof, and will therefore not be damaged by the heat treatment.

Next, as shown in FIG. 7, a transparent electrode 32 is formed on the multilayer body 46 and the P+ type Si layer 22, and the multilayer wiring layer 5 is formed by forming the interlayer insulative film 6. Next, the leveling film 9, color filter 10, and microlens 11 are formed on the multilayer wiring layer 5. Thereby the solid-state imaging device 41 is manufactured.

With this embodiment, a negative potential can be applied to the top surface and the side surface of the N type Si layer 8 through the P+ type Si layer 22 and the P type layer 42, by applying a negative electrical potential to the transparent electrode 32. On the other hand, an electrical potential higher than the transparent electrode 32 will be applied to the P type well 3. Thereby, the electrons generated in the N type Si layer 8 can more positively be drawn into the N type region 4. Furthermore, the top surface and the side surface of the N type Si layer 8 are covered with the P+ type Si layer 22 and the P type layer 42 and do not contact with the interlayer insulative film 6, so the dark current generated at the interface between the epitaxial layer and the insulative film can be further reduced. The construction, function, and effects of this embodiment other than those described above are the same as for the aforementioned third embodiment.

Note, with the present embodiment, the case was shown where a BSG film 43 was formed on the opening 47 and a P type layer 42 was formed by dispersing B from this BSG film 43 into the N type Si layer 8, but the present invention is not restricted to this situation. For example, with the aforementioned process shown in FIG. 8, boron may be ion injected from an inclined direction with regards to the interlayer insulative film 6 which is exposed on the side surface of the opening 47, after the opening 47 is formed in the multilayer body 46. Therefore, when the N type Si layer 8 is subsequently formed in the opening 47 and a heat treatment is performed, the boron that was injected into the interlayer insulative film 6 will be dispersed in the N type Si layer 8, and a P type layer can be formed on the side surface of the N type Si layer 8.

The characteristics of the present invention were described above while referring to the first through fourth embodiments, but the present invention is not restricted to these embodiments.

For example, in FIG. 1, an example where the pixels were arranged in a matrix was described, but the form of the pixel arrangement is not restricted to a matrix, and for instance a honeycomb configuration is also acceptable.

Furthermore, in each of the aforementioned embodiments, the case was shown where the conductive form of the P type well 3 (region of the first conductivity type), P+ type Si layer 22 (layer of the first conductivity type), and the P type layer 42 (another layer of the first conductivity type) were all P type, and the conductive form of the N type region 4 (region of the second conductivity type) and the N type Si layer 8 (layer of the second conductivity type) were N type, but these conductive forms can be reversed.

Furthermore, with each of the aforementioned embodiments, an example where a P type well 3 was formed on the surface of the silicon substrate 2 was shown, but the present invention is not restricted to this case, and for instance a P type substrate can be used as the silicon substrate 2, and the formation of the P type well can be omitted.

Furthermore, in the aforementioned second through fourth embodiments, the case where a P+ type Si layer 22 applies a potential to the top edge of the N type Si layer 8 was shown, but the electric potential can also be applied by directly connecting the wiring 7 or the transparent electrode 32 to the N type Si layer 8 without establishing a P$^+$ type Si layer 22.

Moreover, the scope of the present invention also includes appropriate design changes that may be added by one skilled in the art to any of the aforementioned embodiments, as well as designs where a portion of the components are added or deleted from any of the embodiment alternatives so long as the characteristics of the present invention are achieved.

The invention claimed is:

1. A solid-state imaging device, comprising:
   a substrate having a region of a first conductivity type on at least a portion of a surface thereof;
   a region of a second conductivity type formed on at least a portion of a surface of the region of the first conductivity type;
   a multilayer wiring layer formed on the substrate; and
   a layer of the second conductivity type formed directly above the region of the second conductivity type in the multilayer wiring layer, connected to the region of the second conductivity type;
   a concentration of impurities in the layer of the second conductivity type being lower with decreasing proximity to the region of the second conductivity type.

2. The solid-state imaging device according to claim 1, further comprising a layer of the first conductivity type which is connected to a top surface of the layer of the second conductivity type.

3. The solid-state imaging device according to claim 2, wherein the layer of the first conductivity type is connected to a wiring of the multilayer wiring layer.

4. The solid-state imaging device according to claim 2, further comprising a transparent electrode formed in the multilayer wiring layer, the transparent electrode being connected to the layer of the first conductivity type.

5. The solid state imaging device according to claim 2, wherein when an electric potential lower than an electric potential of the region of the first conductivity type is applied to the layer of the first conductivity type, electrons which are generated by photoelectric conversion in the layer of the second conductivity type are drawn towards the region of the first conductivity type.

6. The solid-state imaging device according to claim 2, wherein another layer of the first conductivity type connected to the layer of the first conductivity type is formed on a side surface of the layer of the second conductivity type.

7. The solid-state imaging device according to claim 6, further comprising an insulative film which contains an impurity of the first conductivity type and is located on the outer side of the other layer of the first conductivity type.

8. The solid-state imaging device according to claim 7, wherein the region of the first conductivity type is made of P type silicon, the region of the second conductivity type and the layer of the second conductivity type are made of N type silicon, the other of layer of the first conductivity type is made of P type silicon containing boron, and the insulative film is made of Boron Silicate Glass (BSG).

9. The solid-state imaging device according to claim 1, wherein a shape of the layer of the second conductivity type is a pillar shape extending in a perpendicular direction to the surface of the substrate.

10. The solid-state imaging device according to claim 1, wherein when viewed from a direction perpendicular to the surface of the substrate, an outer edge of the layer of the second conductivity type either matches an outer edge of the region of the second conductivity type, or is located to an inside of an outside edge of the region of the second conductivity type.

11. The solid-state imaging device according to claim 1, which is a charge coupled device (CCD), and a photo diode is formed by forming a PN junction between the region of the first conductivity type and the region of the second conductivity type.

12. A solid-state imaging device according to claim 1, which is a Complementary Metal Oxide Semiconductor (CMOS) sensor, and a photo diode is formed by forming a PN junction between the region of the first conductivity type and the region of the second conductivity type.

* * * * *